United States Patent [19]

Urata et al.

[11] 4,455,365

[45] Jun. 19, 1984

[54] SILVER HALIDE PHOTOGRAPHIC MATERIAL FOR PHOTOMECHANICAL PROCESS AND REDUCTION PROCESSING METHOD THEREOF

[75] Inventors: Yukihide Urata; Yasuo Kasama; Shigenori Moriuchi; Eiichi Okutsu, all of Kanagawa, Japan

[73] Assignee: Fuji Photo Film Co., Ltd., Kanagawa, Japan

[21] Appl. No.: 411,784

[22] Filed: Aug. 26, 1982

[30] Foreign Application Priority Data

Aug. 26, 1981 [JP] Japan ................ 56-133889

[51] Int. Cl.$^3$ .................... G03C 1/02; G03C 5/42
[52] U.S. Cl. ................ 430/309; 430/265; 430/302; 430/403; 430/430; 430/496; 430/539; 430/950; 430/961
[58] Field of Search .......... 430/950, 961, 302, 309, 430/539, 265, 403, 430, 496

[56] References Cited

U.S. PATENT DOCUMENTS

| | | | |
|---|---|---|---|
| 3,600,174 | 8/1971 | Milton | 430/435 |
| 3,832,181 | 8/1974 | Dallon et al. | 430/539 |
| 4,233,400 | 11/1980 | Fujiwhara et al. | 430/961 |
| 4,369,245 | 1/1983 | Beruto et al. | 430/961 |

*Primary Examiner*—Mary F. Downey
*Attorney, Agent, or Firm*—Sughrue, Mion, Zinn, Macpeak and Seas

[57] ABSTRACT

A silver halide photographic material for a photomechanical process which has an excellent reduction processing aptitude is disclosed. The material is comprised of a support having a light-sensitive silver halide emulsion layer thereon and a light-insensitive layer disposed outside the silver halide emulsion layer. The light-insensitive layer contains a hydrophilic colloidal binder coated in such an amount per unit area as to be 1.0 or more times that of a hydrophilic colloidal binder contained in the silver halide emulsion layer.

8 Claims, No Drawings

SILVER HALIDE PHOTOGRAPHIC MATERIAL FOR PHOTOMECHANICAL PROCESS AND REDUCTION PROCESSING METHOD THEREOF

FIELD OF THE INVENTION

The present invention relates to a silver halide photographic material for a photomechanical process (hereinafter abbreviated as a photographic material for a photomechanical process), and a reduction processing method thereof.

BACKGROUND OF THE INVENTION

The photographic material for photomechanical process is used for making dot images or line images which is necessary to make a printing plate using photomechanical process.

In many cases such a photographic material for a photomechanical process is submitted to a particular type of processing called reduction processing at the final stage of forming a dot or line image in order to finely retouch part or all of the image for the purpose of reproducing a subtle tone or satisfying artistic presentation.

Therefore, it is very important for the photographic material for a photomechanical process to have a reduction processing aptitude.

An example of a method for carrying out reduction-processing of a photographic material for a photomechanical process which has dot images or line images formed through optical exposure and development-processing involves bleaching the metal silver, which constitutes the dot or line images, with an oxidizing agent.

Specifically, C. E. K. Mees, *The Theory of the Photographic Process*, pp. 738–739, Macmillan, New York (1954) describes reducers which use reducing components such as a permanganate, a ferric salt, a ceric salt, a hexacyanoferrate (III), a dichromate, a persulfate and so on.

Reduction processing is, in the ultimate analysis, oxidization of the silver image and therethrough, solubilization of the silver image. Therefore, the extent to which the image can be retouched by reduction processing generally increases with the quantity per unit area of silver which constitutes the image.

More specifically, when reduction processing a dot image, diminishing of the dot area due to the reduction processing is, in general, accompanied by a decrease in the blackening density of the dots. Accordingly, the smaller the decrease in blackening density to a dot upon diminution of the dot area is, the greater the extent to which the image can be retouched by reduction.

In other words, the extent to which a dot image can be retouched is represented by the extent it is possible to diminish the dot area blackening density of a dot while maintaining the density at some definite value or higher.

In the present specification, the extent of diminution of the dot area when its blackening density is decreased by a reduction processing to the lowest value which can be used in the photomechanical process, compared with the dot area prior to the reduction processing, is expressed in terms of the reduction width.

As described above, the larger the amount of silver which constitutes image is, the wider the reduction width becomes. Consequently, the greater the retouchable extent of the image due to the reduction processing becomes.

At first, it would appear as though a good solution to the problem would be to increase the amount of silver halide to be coated per unit area of the photographic material for a photomechanical process. However, silver is very expensive and valuable and consequently, it is undesirable to increase the coverage of silver.

Because of these circumstances, one of important problems in the art has been to contrive methods for imparting all of the necessary characteristics for a photographic material for a photomechanical process while using silver in the smallest possible amount.

In general, a photographic material for a photomechanical process has a gelatin protective layer on a silver halide emulsion layer. However, an amount of a hydrophilic colloid contained in the gelatin protective layer is, in general, 0.5 or less times that of a hydrophilic colloid contained in the silver halide emulsion layer. For example, U.S. Pat. No. 3,600,174 discloses a high-contrast photographic material wherein 130 mg/ft$^2$ or more of gelatin is coated on a silver halide emulsion layer. However, the maximum amount of gelatin coated on the silver halide emulsion layer in said U.S. Patent is only a slightly higher than 0.5 times the amount of gelatin contained in the silver halide emulsion layer. Such a maximum coating amount of hydrophilic colloid of the gelatin protective layer cannot improve reduction processing aptitude of the photographic material.

SUMMARY OF THE INVENTION

Therefore, a primary object of the present invention is to provide a photographic material for a photomechanical process having excellent reduction processing aptitude.

Another object of the present invention is to provide a photographic material for a photomechanical process which suffers no deterioration in its reduction processing aptitude even when the silver content per unit area therein is decreased.

A third object of the present invention is to provide a reduction processing method which makes it possible to broaden the reduction width while using a photographic material for a photomechanical process which contains silver coated in a reduced amount per unit area.

The above-described objects of the present invention are attained with a photographic material for a photomechanical process which has on a support a light-sensitive silver halide emulsion layer and a light-insensitive layer disposed outside of the silver halide emulsion layer. The light-insensitive layer contains a hydrophilic colloidal binder coated in such an amount per unit area as to be 1.0 or more times that of a hydrophilic colloidal binder contained in the silver halide emulsion layer. The method for the reduction processing of the present invention is carried out wherein the above-described photographic material for a photomechanical process is exposed and developed, and subsequently, the obtained silver images are reduction processed with a reducer.

DETAILED DESCRIPTION OF THE INVENTION

In this disclosure the term "a photographic material for a photomechanical process" refers to all silver halide photographic materials employed for making dot images and line images which are necessary to make a printing plate using a photomechanical process. The term is not subject to any particular restrictions. However, the most commonly used silver halide photographic materials are contrast sensitive materials such as socalled lith films.

There are no particular restrictions on silver halides used in the light-sensitive silver halide emulsion layers which make up the photographic material for a photomechanical process of the present invention. For example, silver chlorobromide, silver chloroiodobromide, silver iodobromide, silver bromide and so on can be employed. It is especially preferable to employ silver chlorobromide or silver chloroiodobromide containing silver chloride in a proportion of at least 60 mol% (more preferably 75 mol% or more) and containing silver iodide in a proportion of 0 to 5 mol%. In addition, there are no particular limitations relating to the crystal form, crystal habit and grain size distribution of the silver halide grains. However, the silver halide grains having sizes of $0.5\mu$ or less are preferred.

The silver halide emulsions can be sensitized with gold compounds such as chloroaurates, gold trichloride and the like; salts of noble metals such as rhodium, iridium and the like; sulfur compounds capable of producing silver sulfate by reacting with silver salts; and reducing substances such as stannous salts and amines without being accompanied by coarsening of the silver halide grains.

Further, at the time of the physical ripening step of the silver halide grains or upon the nucleation, salts of noble metals such as rhodium and iridium, and iron compounds such as hexacyano ferrate (III) and the like may also be present in the silver halide emulsions.

Various types of hydrophilic colloidal binders can be employed in the present invention. However, gelatin is preferred.

Suitable examples of such hydrophilic colloidal binders include proteins such as gelatin derivatives, graft polymers of gelatin and other high polymers, albumin, casein and so on; sugar derivatives such as cellulose derivatives (e.g., hydroxyethyl cellulose, carboxymethyl cellulose, cellulose sulfuric acid esters, etc.), sodium alginate, starch derivatives and so on; and various kinds of synthetic hydrophilic macromolecular substances such as homopolymers or copolymers with specific examples including polyvinyl alcohol, partial acetal of polyvinyl alcohol, poly-N-vinylpyrrolidone, polyacrylic acid, polymethacrylic acid, polyacrylamide, polyvinylimidazole, polyvinylpyrazole and the like.

Specific examples of useful gelatins include lime-processed gelatin as well as acid-processed gelatin and enzyme-processed gelatin as described in *Bull. Soc. Sci. Phot. Japan*, No. 16, p. 30 (1966). In addition, hydrolysis products and enzymatic degradation products of gelatins can also be employed.

It is possible to include additives in the silver halide emulsion layers and other layers such as polymer latexes comprised of homo- or copolymers of alkylacrylate, alkylmethacrylate, acrylic acid and glycidylacrylate as described in U.S. Pat. Nos. 3,411,911, 3,411,912, 3,142,568, 3,325,286 and 3,547,650 and published examined Japanese Patent Application No. 5331/70. Such materials are added to raise the dimensional stability of the photographic material and improve the physical properties of the resulting film.

Suitable examples of anti-foggants which can be incorporated into the photographic emulsions of the present invention include 4-hydroxy-6-methyl-1,3,3a,7-tetraazaindene, 3-methylbenzothiazole, 1-phenyl-5-mercaptotetrazole and other various kinds of heterocyclic compounds; mercury-containing compounds; mercapto compounds; and further, other anti-foggants well-known in the art, as described in Japanese Patent Applications (OPI) Nos. 81024/74, 6306/75 and 19429/75 (the term "OPI" as used herein refers to a "published unexamined Japanese patent application"), and U.S. Pat. No. 3,850,639.

The hardeners used in connection with this invention are not subject to any special restriction. Examples of hardeners which are preferably employed include aldehyde compounds; ketone compounds; active halogen-containing compounds such as 2-hydroxy-4,6-dichloro-1,3,5-triazine; active olefin-containing compounds such as vinylsulfone compounds; N-methylol compounds; aziridine compounds; carbodiimide compounds; and so on.

Surface active agents can be added to the silver halide emulsion layers of the present invention as a coating aid, or for other purposes, for example, to improve photographic characteristics, and so on.

Examples of suitable surface active agents include natural surface active agents such as saponin; nonionic surface active agents of the alkylene oxide type, the glycidol type and so on; anionic surface active agents containing acid groups such as a carboxylic acid group, a sulfonic acid group (e.g., surface active agents described in U.S. Pat. No. 3,415,649), a phosphoric acid group, a sulfate group, a phosphate group, etc.; and amphoteric surface active agents of the amino acid type, the aminosulfonic acid type, the sulfates or the phosphates of aminoalcohols and so on.

Polyalkylene oxide compounds used in the present invention include condensation products of polyalkylene oxides which include at least 10 units of alkylene oxide moieties each including 2 to 4 carbon atoms (for example, ethylene oxide, propylene-1,2-oxide, butylene-1,2-oxide, and especially ethylene oxide) and compounds containing at least one active hydrogen in their individual molecule, such as water, aliphatic alcohols, aromatic alcohols, fatty acids, organic amines, hexitol derivatives and so on; block copolymers containing two or more of different polyalkylene oxide chains; and so on. More specifically, the polyalkylene oxide compounds which can be used include polyalkylene glycols, polyalkylene glycol alkyl ethers, polyalkylene glycol aryl ethers, polyalkylene glycol alkyl esters, polyalkylene glycol aryl esters, polyalkylene glycol esters, polyalkylene glycol fatty acid amides, polyalkylene glycol amines, polyalkylene glycol block-copolymer, polyalkylene glycol graft polymers and so on.

Specific examples of polyalkylene oxide compounds preferably used in the present invention are illustrated below:

1. $HO(CH_2CH_2O)_9H$
2. $C_{12}H_{25}O(CH_2CH_2O)_{15}H$
3. $C_8H_{17}CH=CHC_8H_{16}O(CH_2CH_2O)_{15}H$
4. 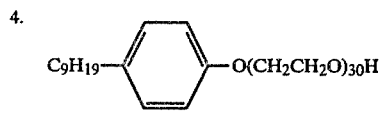

$C_9H_{19}$—⟨phenyl⟩—$O(CH_2CH_2O)_{30}H$

5. $C_{11}H_{23}COO(CH_2CH_2O)_{80}H$
6. $C_{11}H_{23}CONH(CH_2CH_2O)_{15}H$

7. 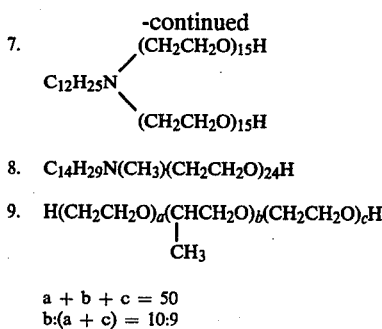

8. $C_{14}H_{29}N(CH_3)(CH_2CH_2O)_{24}H$

9. $H(CH_2CH_2O)_a(CHCH_2O)_b(CH_2CH_2O)_cH$
$\quad\quad\quad\quad\quad\quad\quad\quad |$
$\quad\quad\quad\quad\quad\quad\quad\quad CH_3$ $a + b + c = 50$
$b:(a + c) = 10:9$ In the silver halide emulsion layer of the present invention, the ratio of the content of the hydrophilic colloidal binder to the content of silver halide is preferably ½ or smaller by weight.

The silver halide emulsion layer of the present invention may have a single layer structure or a multilayer structure made up of two or more layers.

For instance, in the case of a double layer structure, the ratio of the total content of hydrophilic colloidal binders in the two layers to the total content of silver halides therein is controlled to ½ or less by weight and it is more preferable if the hydrophilic colloidal binder is contained in the upper layer in an amount larger than in the lower layer.

In addition, the silver halide is preferably coated at a coverage of 1.0 to 6.0 g silver, and particularly 1.5 to 4.5 g silver, per square meter.

The method of the present invention produces a more remarkable effect when the photographic material for a photomechanical process contains silver in a smaller amount.

An example of the light-insensitive layer to be provided upper side of the silver halide emulsion layer in the present invention includes a surface protective layer.

It is an essential condition to the present invention that the coverage of a hydrophilic colloidal binder which constitutes the light-insensitive layer is adjusted to 1.0 or more, and preferably 1.0 to 3.0, times that of the hydrophilic colloidal binder contained in the silver halide emulsion layer.

In the present invention, the light-insensitive layer may be made up of one layer, or two or more layers.

For instance, when the light-inseisitive layer has a double layer structure, its constituent layers may differ with respect to coverage of the hydrophilic colloidal binder, and so on. More specifically, coverage of the hydrophilic colloidal binder making up the upper layer is preferably selected so as to become thicker than that of the hydrophilic colloidal binder contained in the lower layer.

In the present invention, both the silver halide emulsion layer and the light-insensitive layer may be comprised of two or more layers. In such a case, total coverage of hydrophilic colloidal binders in the light-insensitive layers is the same as or greater than the total amount of hydrophilic colloidal binder in the silver halide emulsion layers.

In addition to the above-described hydrophilic colloidal binder (e.g., gelatin), the light-insensitive layer of the present invention can contain a surface active agent, an antistatic agent, a matting agent, a slipping agent, colloidal silica, a gelatin plasticizing agent, a polymer latex and so on.

Preferable examples of the matting agent include grain-shaped polymethylmethacrylate and silicon dioxide, each having a grain size of about 0.1 to 10μ, more preferably about 1 to 5μ.

Examples of supports preferably used in the photographic material for a photomechanical process of the present invention include polyester films such as a polyethylene terephthalate film, and cellulose ester films such as a cellulose triacetate film.

In the present invention, the exposure for obtaining a photographic image may be carried out in a conventional manner. Any various known light sources including natural light (sunlight), a tungsten lamp, a fluorescent lamp, a mercury lamp, a xenon arc lamp, a carbon arc lamp, a xenon flash lamp, a cathode-ray tube flying spot and so on can be employed for the exposure. Suitable exposure times which can be used include not only exposure times commonly used in cameras ranging from about 1/1,000 to about 1 second, but also exposure times shorter than 1/1,000 second, for example, about $1/10^4$ to about $1/10^6$ second as used with xenon flash lamps and cathode-ray tubes. Exposure times longer than 1 second can also be used. The spectral distribution of the light employed for the exposure can be controlled using color filters, if desired. Laser beams can also be employed for the exposure.

The present invention does not put any particular restriction on the development-processing of the photographic material for a photomechanical process. In general, any developing processes applied to conventional photographic material for a photomechanical process can be adopted in the development-processing. Suitable processing temperatures used generally range from 18° C. to 50° C. However, processing temperatures lower than 18° C. or higher than 50° C. may be employed.

The developing solution can contain any known developing agents. Examples of developing agents which can be used alone or in mixtures include dihydroxybenzenes (e.g., hydroquinone), 3-pyrazolidones (e.g., 1-phenyl-3-pyrazolidone), aminophenols (e.g., N-methyl-p-aminophenol), 1-phenyl-3-pyrazolines, ascorbic acid, heterocyclic compounds of the kind which are obtained by condensating 1,2,3,4-tetrahydroquinoline rings and indolene rings as described in U.S. Pat. No. 4,067,872. In addition to such a developing agent as described above, the developing solution can contain a known preservative, an alkali agent, a pH buffer, an anti-foggant and so on. Further, it may optionally contain a dissolving aid, a color toning agent, a development accelerator, a surface active agent, an antifoaming agent, a water softener, a hardener, a viscosity imparting agent and so on.

The developing solution which can be employed to great advantage in the present invention is a so-called lith developer as described in T. H. James, *The Theory of the Photographic Process*, 4th Ed., pp. 419-421, Macmillan (1977). The lith developer is basically comprised of an ortho- or a para-dihydroxybenzene, an alkali agent, a small amount of free sulfite and a sulfite ion buffer and so on. The ortho- or the paradihydroxybenzene used as the developing agent can be properly selected from those well known in the photographic art. Specific examples of these compounds include hydroquinone, chlorohydroquinone, bromohydroquinone, isopropylhydroquinone, toluhydroquinone, methylhydroquinone, 2,3-dichlorohydroquinone, 2,5-dimethylhydroquinone and the like. Among these hydroquinones, hydroquinone is particularly suitable for practical use. These developing agents may be employed independently or in combination. A suitable amount of the developing agent to be added ranges from 1 to 100 g, more preferably 5 to 80 g, per liter of the developing solution.

A sulfite ion buffer is employed in the developing solution in an amount such that a sulfite ion concentration therein is effectively maintained approximately constant. Suitable examples of such buffers include adducts of aldehydes and alkali metal bisulfites such as formalin-sodium bisulfite adduct, adducts of ketones and alkali metal bisulfites such as acetone-sodium bisulfite adduct, a condensation products of carbonyl bisulfites and amines such as sodium bis(2-hydroxyethyl)aminomethane sulfonate, and so on. The sulfite ion buffer is generally added in an amount of 13 g to 130 g per liter of the developing solution.

In general, the concentration of free sulfite ions is controlled by the addition to the developing solution of an alkali metal sulfite such as sodium sulfite and the like. The amount of the sulfite added is generally 5 g or less, and particularly 3 g or less, per liter of the developing solution. Of course, the sulfite may be added in an amount of larger than 5 g.

In many cases, it is desirable to further add an alkali metal halide (especially a bromide such as sodium bromide, potassium bromide or the like) as a development-controlling agent. A suitable amount of the alkali metal halide to be added ranges preferably from 0.01 g to 10 g, most preferably 0.1 g to 5 g, per liter of the developing solution.

An alkali is added to adjust the developing solution to a pH of 9.0 or more (particularly to a pH of 9.7 to 11.5). Examples of alkalis generally used in the developing solution include sodium carbonate and potassium carbonate, and such a carbonate is in greatly differing amounts.

The fixation can be carried out using a fixing solution having a conventionally used composition.

Examples of fixing agents which can be used include thiosulfates, thiocyanates and further, organic sulfur compounds which are known to have effects as fixing agents.

In the fixing solution, water-soluble aluminum salts may be incorporated as a hardener. In the case of dye image formation, conventional methods can be used in the fixing processing of the present invention.

Development-processing may be performed by hand labor, or by using an automatic developing machine. In the case of automatic development-processing, there are no restrictions as to the conveying means (e.g., a roller conveyer, a belt conveyer, etc.), and conveyance type automatic developing machines which have been used in the art can be employed. For further details of the compositions of processing solutions and the developing processes descriptions in U.S. Pat. Nos. 3,025,779, 3,078,024, 3,122,086, 3,149,551, 3,156,173, 3,224,356 and 3,573,914 and so on can be referred to.

Furthermore, for details of the silver halide emulsion layers, other layers and the support making up the photographic material for a photomechanical process of the present invention and for details of the processing process to be adopted in the present invention, descriptions in *Research Disclosure*, Vol. 176, pp. 22-28 (Dec. 1978) can be referred to.

There are no particular restrictions with respect to the reducing solution used in the present invention. For example, those described in C. E. K. Mees, *The Theory of the Photographic Process*, pp. 737-744, Macmillan (1954) can be effectively employed. Specifically, a reducing solution which contains as a reducing component a permanganate, a persulfate, a ferric salt, a cupric salt, a ceric salt, a hexacyanoferrate (III), a dichromate and the like independently or in combination and optionally, an inorganic acid such as sulfuric acid, and an alcohol; or a reducing solution which contains a reducing component such as a hexacyanoferrate (III), ethylenediaminetetraacetatoferrate (III) or the like, and a silver halide solvent such as a thiosulfate, a thiocyanate, thiourea or the derivatives thereof and, optionally, an inorganic acid such as sulfuric acid, can be employed. Representative examples of the reducing solution are Farmer's reducer comprising potassium ferricyanide and sodium thiosulfate (Kodak R-4), a reducing solution comprising a persulfate and potassium permanganate (Kodak R-5), a reducing solution comprising a persulfate (Kodak R-15) and a reducing solution comprising a ceric salt.

To the reducing solution to be employed in the present invention, a compound having a mercapto group, such as 2-amino-5-mercapto-thiadiazole, 1-phenyl-5-mercaptotetrazole, 2-amino-ethanthiol, monothioglycerol, etc., those described in Japanese Patent Applications (OPI) Nos. 17123/80 and 68419/77 may be further added, if desired.

As for the composition of the reducing solution used in the reduction processing of the present invention and the processing conditions (temperature, time, etc.) therein, there are no particular limitations. These conditions can be properly selected by one skilled in the art.

The reduction processing of whole image can be carried out by immersing the photographic material for a photomechanical process in a reducing solution. In order to apply the reduction processing to a part of image, the reducing solution may be coated on the desired part of the image using a brush.

For details of the reducing solutions and the reduction processing which can be employed descriptions in the following patent specifications can be referred to: They include Japanese Patent Applications (OPI) Nos. 140733/76, 6841/77, 14901/78, 119236/79, 119237/79, 2245/80, 2244/80, 17123/80, 79444/80 and 81344/80.

The mechanism by which the method of the present invention operates is not clearly understood. However, it is believed that upon the bleaching of silver image areas with an oxidizing agent in the reducing solution, the bleaching speed of the oxidizing agent diffusing into the silver image area from the upper side and the bleaching speed of the oxidizing agent diffusing into the silver image area from the sides via non-image areas adjacent thereto are so well-balanced that the decrease in the blackening density of silver image proceeds more slowly than the diminution in the image area.

Whether or not the above-described mechanism is ture, the functional effect exhibited by the construction of the present invention was entirely unexpected.

The present invention will now be illustrated in more detail by reference to the following examples. However, the spirit and scope of the present invention should not be construed as being limited to the following examples.

EXAMPLE 1

A silver halide emulsion containing 80 mol% silver chloride, 19.5 mol% of silver bromide and 0.5 mol% of silver iodide was subjected to gold sensitization and sulfur sensitization in conventional manners. The mean grain size of the thus prepared silver halide grains was 0.30μ. The proportion of gelatin to the silver halide contained in this emulsion was 45 wt%. To this emulsion were added in sequence 3-carboxymethyl-5-[2-(3-ethylthiazolinylidene)ethylidene]rhodanine (spectral sensitizer), 4-hydroxy-1,3,3a,7-tetraazaindene (stabilizer), mucochloric acid (hardener), polyoxyethylene nonylphenyl ether containing 30 ethylene oxide groups and a polymer latex as described in Synthetic Example Formula 3 of U.S. Pat. No. 3,525,620. The resultant mixture was then coated on polyethylene terephthalate film bases in such amounts that the coverages of silver halide became (1) 6.4 g/m², (2) 5.6 g/m², (3) 4.9 g/m² and (4) 3.5 g/m², respectively.

Further, gelatin was coated on each of the silver halide emulsion layers having the above-described coverages in such amounts that the coverages of gelatin became (a) 1.4 g/m², (b) 2.8 g/m², and (c) 3.2 g/m², separately. Thus, samples shown in Table 1 were obtained.

TABLE 1

| Gelatin-Silver Halide in Silver Halide Emulsion Layer | Gelatin Layer | | |
|---|---|---|---|
| | (a) 1.4 g/m² | (b) 2.8 g/m² | (c) 3.2 g/m² |
| (1) 2.9–6.4 g/m² | (1) - (a) | (1) - (b) | (1) - (c) |
| (2) 2.5–5.6 g/m² | (2) - (a) | (2) - (b) | (2) - (c) |
| (3) 2.2–4.9 g/m² | (3) - (a) | (3) - (b) | (3) - (c) |
| (4) 1.6–3.5 g/m² | (4) - (a) | (4) - (b) | (4) - (c) |

When the coverages of silver halides in Table 1 are converted into those of silver, (1) corresponds to 4.5 g silver/m², (2) 4.0 g silver/m², (3) 3.5 g silver/m₂, and (4) 2.5 g silver/m².

Each of these samples was exposed and developed according to the following processes to form a dot image.

A commercially available gray contact screen for a negative (150 lines/inch) was brought into close contact with the sample, and exposed through a step wedge having a difference of 0.1 to white light generated from a tungsten lamp for a period of 10 sec. and developed at 20° C. for 30 min. using the lith developing solution having the following composition, followed by fixation, washing and drying steps in conventional manners, respectively.

| Composition of Lith Developing Solution | |
|---|---|
| Sodium Carbonate (monohydrate) | 50 g |
| Formaldehyde-Hydrogensulfite Adduct | 45 g |

| Composition of Lith Developing Solution | |
|---|---|
| Potassium Bromide | 2 g |
| Hydroquinone | 18 g |
| Sodium Sulfite | 2 g |
| Water to make | 1 l |

Each of the thus obtained halftone strips was dipped in the reducing solution having the following composition at 20° C. for two separate periods of time, i.e., 40 sec. and 80 sec. and then washed with water.

| Reducing Solution (Farmer's Reducer) | |
|---|---|
| First Solution | |
| Water | 200 ml |
| Sodium Thiosulfate | 20 g |
| Second Solution | |
| Water | 100 ml |
| Hexacyanoferrate (III) | 10 g |

Just before use, the reducing solution was prepared by mixing 100 parts of the first solution, 5 parts of the second solution and 100 parts of water.

Changes in the dot area and in the dot density of the thus obtained dot strips were each measured using a microdensitometer. The results obtained are shown in Table 2.

Further, each sample strip was subjected to a reduction processing in the same manner as above. When $D_{max}$ value reached to 2.5, dot area (B) was measured. The reduction width (X) is expressed in terms of percent reduction of dot area based on the dot area before the reduction processing (A).

$$X = \frac{A - B}{A} \times 100 \, (\%)$$

X: reduction width
A: dot area before reduction processing
B: dot area at $D_{max}$ of 2.5 after reduction processing
The results obtained are also shown in Table 2.

TABLE 2

| Sample | Before Reduction | | Reduction (40 sec.) | | Reduction (80 sec.) | | Reduction Width (%) | Remark |
|---|---|---|---|---|---|---|---|---|
| | Dot Area (%) | Dot Density | Dot Area (%) | Dot Density | Dot Area (%) | Dot Density | | |
| (1)-(a) | 50 | 4.0 or more | 43 | 4.0 or more | 30 | 3.0 | 23 | Comparison |
| (1)-(b) | 50 | 4.0 or more | 44 | 4.0 or more | 31 | 3.1 | 24 | " |
| (1)-(c) | 50 | 4.0 or more | 46 | 4.0 or more | 35 | 4.0 or more | 28 | Invention |
| (2)-(a) | 50 | 4.0 or more | 38 | 3.9 | 25 | 2.3 | 22 | Comparison |
| (2)-(b) | 50 | 4.0 or more | 40 | 4.0 or more | 30 | 3.5 | 26 | Invention |
| (2)-(c) | 50 | 4.0 or more | 43 | 4.0 or more | 33 | 3.8 | 27 | " |
| (3)-(a) | 50 | 4.0 or more | 36 | 3.3 | 15 | 1.0 | 18 | Comparison |
| (3)-(b) | 50 | 4.0 or more | 38 | 3.8 | 25 | 2.6 | 25 | Invention |
| (3)-(c) | 50 | 4.0 or more | 43 | 3.9 | 29 | 3.0 | 26 | " |
| (4)-(a) | 50 | 3.8 | 31 | 2.0 | Nothing | Nothing | 12 | Comparison |
| (4)-(b) | 50 | 3.8 | 34 | 2.9 | 20 | 2.1 | 18 | Invention |
| (4)-(c) | 50 | 3.8 | 39 | 3.3 | 28 | 2.6 | 19 | " |

As can be seen from Table 2, in each of the samples prepared in accordance with the embodiments of the present invention the dot density is lowered to a smaller extent by reduction processing so that its dot area is diminished to a great extent. More specifically, each of the samples of the present invention has a broader reduction width, compared with the comparative samples. In addition, such a tendency as described above turns out to be more remarkable especially in samples containing silver in smaller amounts.

EXAMPLE 2

The same silver halide emulsion, which was finished by the addition of various additives, as described in Example 1 was coated on a polyethylene terephthalate film base at a coverage of 4.9 g silver halide per square meter. On the silver halide emulsion layer thus coated, gelatin was further coated at a coverage of 1.4 g/m² to prepare a Sample A.

A portion was taken out from the Sample A and on the side of the gelatin layer, a gelatin solution containing a matting agent of polymethylmethacrylate grains measuring 1 to 5μ in size in a proportion of 3 wt% to the gelatin was further coated at a coverage of 1.0 g gelatin per square meter to prepare a Sample B.

Separately, the above-described silver halide emulsion was coated on a polyethylene terephthalate film base at a coverage of 2.9 g silver halide per square meter. A different silver halide emulsion, which was prepared by adding gelatin to the same silver halide emulsion as described above in a proportion of 100 wt% to the silver halide, was then coated on the silver halide emulsion layer at a coverage of 2.0 g silver halide per square meter. A gelatin was further coated on this layer at a coverage of 1.4 g/m² to prepare a Sample C. Contents of silver and gelatin in each of constituent layers of each of Samples A, B and C are summarized in Table 3.

Reducing capacities of the thus prepared samples were evaluated using the same method as in Example 1, and the results obtained are shown in Table 4.

TABLE 3

| Sample | Total Coverage of Silver | Coverage of Gelatin | | | |
|---|---|---|---|---|---|
| | | Lower Emulsion Layer | Upper Emulsion Layer | Lower Gelatin Layer | Upper Gelatin Layer |
| A | 4.9 g/m² | 2.2 g/m² | Nothing | 1.4 g/m² | Nothing |
| B | 4.9 g/m² | 2.2 g/m² | Nothing | 1.4 g/m² | 1.0 g/m² |
| C | 4.9 g/m² | 1.3 g/m² | 2.0 g/m² | 1.4 g/m² | Nothing |

TABLE 4

| | Before Reduction | | Reduction (40 sec.) | | Reduction (80 sec.) | | |
|---|---|---|---|---|---|---|---|
| Sample | Dot Area (%) | Dot Density | Dot Area (%) | Dot Density | Dot Area (%) | Dot Density | Remark |
| A | 50 | 4.0 or more | 36 | 3.3 | 15 | 1.0 | Comparison |
| B | 50 | 4.0 or more | 37 | 3.7 | 24 | 2.5 | Invention |
| C | 50 | 4.0 or more | 37 | 3.5 | 21 | 1.9 | Comparison |

As can be seen from Table 4, Sample B prepared in accordance with one embodiment of the present invention has a broad reduction width.

On the other hand, the Sample C has a considerably broad reduction width, compared with the Sample A. However, compared with Sample B of the present invention, Sample C exhibits a lowering of dot density to a greater extent, that is, its reduction width becomes narrow.

While the invention has been described in detail and with reference to specific embodiments thereof, it will be apparent to one skilled in the art that various changes and modifications can be made therein without departing from the spirit and scope thereof.

What is claimed is:

1. A silver halide photographic material for a photomechanical process, comprising:
   a support base;
   at least one light-sensitive silver halide emulsion layer on the support base containing silver halide particles in a hydrophilic colloidal binder, wherein the ratio of the amount of the hydrophilic colloidal binder to the silver halide in the light-sensitive layer is 0.5 or less by weight; and
   at least one light-insensitive layer disposed on the light-sensitive layer, the light-insensitive layer being comprised of a hydrophilic colloidal binder coated in an amount of 1.0 or more times per unit area as the hydrophilic colloidal binder of the light-sensitive silver halide emulsion layer.

2. A silver halide photographic material as claimed in claim 1, wherein the silver halide particles are selected from the group consisting of silver chlorobromide or silver chloroiodobromide containing silver chloride in a proportion of at least 60 mol%.

3. A silver halide photographic material as claimed in claim 2, wherein the silver chlorobromide or silver chloroiodobromide contains silver chloride in proportion of 75 mol% or more.

4. A silver halide photographic material as claimed in any of claims 1, 2 or 3, wherein the silver halide particles have a sizes of 0.5μ or less.

5. A silver halide photographic material as claimed in claim 1, wherein silver present on the support base is present in an amount of 1.0 to 6.0 g/m² of support base.

6. A silver halide photographic material as claimed in claim 5, wherein the silver is present on the support base in an amount of 1.5 to 4.5 g/m² of support base.

7. A silver halide photographic material as claimed in claim 1, wherein the hydrophilic colloidal binder in the light-insensitive layer is present in an amount of 1.0 to 3.0 times the amount of hydrophilic colloidal binder in the light-sensitive silver halide emulsion layer.

8. A photomechanical reduction processing method for a silver halide photosensitive material, comprising the steps of:
   providing a silver halide photographic material comprised of a support base, a light-sensitive silver halide emulsion layer on the support base containing silver halide particles in a hydrophilic colloidal binder wherein the ratio of the amount of the hydrophilic colloidal binder to the silver halide in the light-sensitive layer is 0.5 or less by weight, and a light-insensitive layer disposed on the light-sensitive layer, the light-insensitive layer being comprised of a hydrophilic colloidal binder coated in an amount of 1.0 or more times per unit area as the hydrophilic binder of the light-sensitive silver halide emulsion layer;
   subjecting the photographic material to optical exposure;
   developing the optically exposed photographic material; and
   subjecting the developed photographic material to reduction processing.

* * * * *